United States Patent
Kannan et al.

(10) Patent No.: US 9,460,975 B2
(45) Date of Patent: Oct. 4, 2016

(54) DFT STRUCTURE FOR TSVS IN 3D ICS WHILE MAINTAINING FUNCTIONAL PURPOSE

(71) Applicant: GLOBALFOUNDRIES Inc., Grand Cayman (KY)

(72) Inventors: Sukeshwar Kannan, Malta, NY (US); Xiaoqiang Zhang, Rexford, NY (US); Shan Gao, Malta, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 90 days.

(21) Appl. No.: 14/611,496

(22) Filed: Feb. 2, 2015

(65) Prior Publication Data
US 2016/0225679 A1   Aug. 4, 2016

(51) Int. Cl.
  H01L 21/66   (2006.01)
  H01L 21/768   (2006.01)

(52) U.S. Cl.
  CPC ......... H01L 22/14 (2013.01); H01L 21/76886 (2013.01); H01L 21/76898 (2013.01)

(58) Field of Classification Search
  CPC .. H01L 22/10; H01L 22/14; H01L 21/76886
  See application file for complete search history.

(56) References Cited

U.S. PATENT DOCUMENTS

2016/0079166 A1* 3/2016 Farooq ............... H01L 23/5256
                                                257/529

OTHER PUBLICATIONS

Tonti et al., "Reliability and Design Qualification of a Sub-Micron Tungsten Silicide E-Fuse", 42nd Annual International Reliability Physics Symposium, 2004, 5 pages.
Kulkarni, et al., "High-Density 3-D Metal-Fuse PROM featuring 1.37µm2 1T1R Bit Cell in 32nm High-k Metal-Gate CMOS Technology", Symposium on VLSI Circuits Digest of Technical Papers, 2009, 2 pages.
Wu et al., "Investigation of Electrical Programmable Metal Fuse in 28nm and beyond CMOS Technology", 2011, 3 pages.
Tonti, "Reliability, Design Qualification, and Prognostic Opportunity of in Die E-Fuse", 2011, 7 pages.
Natale et al., "Built-In Self-Test for Manufacturing TSV Defects before bonding", IEEE 32nd VLSI Test Symposium (VTS), 2014, 6 pages.

* cited by examiner

*Primary Examiner* — Thanhha Pham
(74) *Attorney, Agent, or Firm* — Ditthavong & Steiner, P.C.

(57) ABSTRACT

Methods of testing TSVs using eFuse cells prior to and post bonding wafers in a 3D IC stack are provided. Embodiments include providing a wafer of a 3D IC stack, the wafer having thin and thick metal layers; forming first and second TSVs on the wafer, the first and second TSVs laterally separated; forming an eFuse cell between and separated from the first and second TSVs; forming a FF adjacent to the second TSV and on an opposite side of the second TSV from the eFuse cell; connecting the first TSV, the eFuse cell, the second TSV, and the FF in series in an electric circuit; and testing the first and second TSVs prior to bonding the wafer to a subsequent wafer in the 3D IC stack.

20 Claims, 8 Drawing Sheets

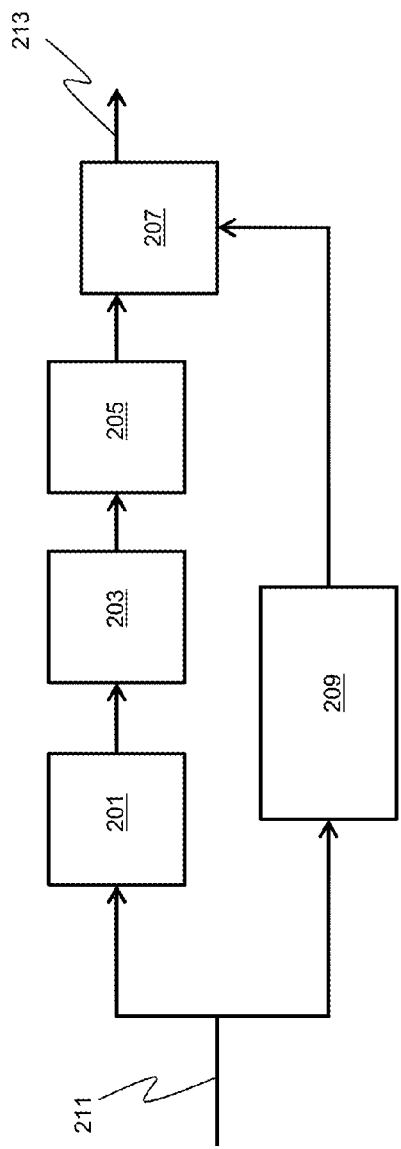
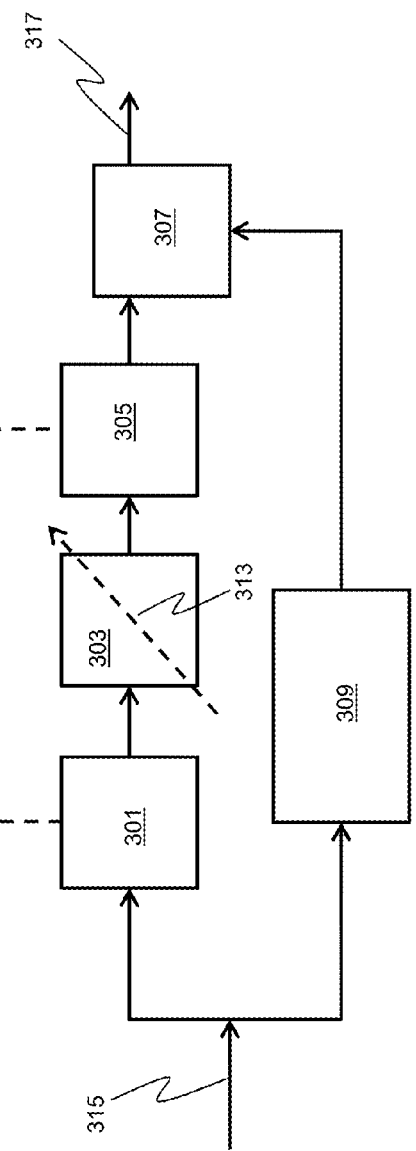

DFT STRUCTURE FOR TSVS IN 3D ICS WHILE MAINTAINING FUNCTIONAL PURPOSE

TECHNICAL FIELD

The present disclosure relates to a manufacture of semiconductor devices, such as integrated circuits (ICs). The present disclosure is particularly applicable to testing through-silicon-vias (TSVs) of three-dimensional (3D) IC stacks.

BACKGROUND

Fabricating 3D ICs using die stacking technology can minimize the impact of altering existing manufacturing technology and equipment. Testing and design-for-testability forms an integral part of 3D IC manufacturing. In traditional IC manufacturing, wafers are probed and individual dies tested (wafer sorting) before they are packaged. In 3D integration, there are a number of challenges that must be overcome before bonding wafers. For example, test access is limited: at any given point during wafer fabrication only the top side of the TSVs can be probed while the bottoms are buried in the substrate. In addition, measurements are single-ended: limited test access results in single-ended measurements, for example, direct current (DC) probing results in current flow only through the surface of a TSV. Further, new types of defects arise, e.g., random open defects can result from dislocations, oxygen trapped on the surface, void formation, and/or mechanical failures. Accordingly, the yield of 3D ICs can be considerably increased if pretested dies can be bonded on top of each other.

A known approach for testing TSVs includes using a TSV test circuit 101 to charge/discharge and sense the voltage level at a TSV top end, as depicted in FIG. 1. The TSV acts as a load capacitor with respect to a test stimulus 103. A Flip Flop (FF) 105 is used to store the OutSensing signal at the TSV Test Circuit output compared to the signal from the Delay Circuit 107. The FF 105 then delivers the TSV Test Result 109. The approach is capable of detecting breaks, voids, and pin-hole type of process-related defects in TSVs with a high defect sensitivity, e.g., approximately 2 femtofarad (fF). However, one test circuit is required for each TSV, which is impractical for testing high density TSVs in wide input/output (I/O) area for memory-on-logic stacking applications. Further, this methodology cannot be implemented to test TSV daisy chains and, therefore, must rely on package level tests, which result in low yields.

A need therefore exists for methodology enabling testing of TSVs at the wafer-level (pre-bond) and also at the package-level (post bond) while maintaining high defect sensitivity.

SUMMARY

An aspect of the present disclosure is a method of testing TSVs using electrical fuse (eFuse) cells prior to bonding subsequent wafers in a 3D IC stack.

Another aspect of the present disclosure is a method of testing TSVs using eFuse cells after bonding wafers in a 3D IC stack.

A further aspect of the present disclosure is a method of testing TSVs using eFuse cells during the die attach/bonding process of a multi-tier 3D IC stack.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: providing a wafer of a 3D IC stack, the wafer having thin and thick metal layers; forming first and second TSVs on the wafer, the first and second TSVs laterally separated; forming an eFuse cell between and separated from the first and second TSVs; forming a FF adjacent to the second TSV and on an opposite side of the second TSV from the eFuse cell; connecting the first TSV, the eFuse cell, the second TSV, and the FF in series in an electric circuit; and testing the first and second TSVs prior to bonding the wafer to a subsequent wafer in the 3D IC stack.

Aspects of the present disclosure include forming the first and second TSVs as first and second wide I/O TSVs, respectively. Other aspects include electrically connecting the first TSV, the eFuse cell, and the second TSV via a thin metal layer of the wafer. Further aspects include forming the first and second TSVs as first and second power/ground TSVs, respectively. Another aspect includes electrically connecting the first TSV, the eFuse cell, and the second TSV via a thick metal layer of the wafer. Additional aspects include forming a delay circuit in parallel with the first TSV, the eFuse cell, and the second TSV and connected to the FF. Other aspects include testing the first and second TSVs by: applying a DC signal simultaneously to the delay circuit and to the first TSV, the eFuse cell, and the second TSV; and comparing transmission rates between the first TSV, the eFuse cell, and the second TSV and the FF and the delay circuit and the FF.

Another aspect of the present disclosure is a method including: providing a wafer of a 3D IC stack, the wafer having thin and thick metal layers; forming one or more pairs of TSVs on the wafer, each TSV of the one or more pairs laterally separated from another TSV of the one or more pairs; forming an eFuse cell between and separated from TSVs within each of the one or more pairs of TSVs; forming a FF adjacent to a last TSV of the one or more pairs of TSVs and on an opposite side of the last TSV from the eFuse cell; connecting each of the one or more pairs of TSVs with a top-die of a subsequent wafer of the 3D IC stack; connecting each of the one or more pairs of TSVs, each eFuse, and the FF in series in an electric circuit; programming each eFuse; and testing the one or more pairs of TSVs after bonding the wafer to a subsequent wafer in the 3D IC stack.

Aspects of the present disclosure include forming a second eFuse cell between two adjacent pairs of TSVs of the one or more pairs of TSVs. Other aspects include forming each TSV of the one or more pairs of TSVs as a wide I/O TSV. Further aspects include electrically connecting the one or more pairs of TSVs, each eFuse cell, and each second eFuse cell via a thin metal layer of the wafer. Another aspect includes forming each TSV of the one or more pairs of TSVs as a power/ground TSV. Additional aspects include electrically connecting the one or more pairs of TSVs, each eFuse cell, and each second eFuse cell via a thick metal layer of the wafer. Other aspects include programming each eFuse cell with an electric pulse in a range of 25 microamps (μA) to 40 μA. Further aspects include forming a delay circuit in parallel with the one or more pairs of TSVs, each eFuse cell, and each second eFuse cell and connected to the FF. Another aspect includes testing the one or more pairs of TSVs by:

applying a DC signal simultaneously to the delay circuit and to the one or more pairs of TSVs, each eFuse cell, and each second eFuse cell; and comparing transmission rates between the one or more pairs of TSVs, each eFuse cell, each second eFuse cell and the FF and the delay circuit and the FF.

A further aspect of the present disclosure is a method including: providing first, second, and third wafers of a 3D IC stack, the first, second, and third wafers having thin and thick metal layers; forming first, second, and third pairs of TSV on the first, second, and third wafers, respectively; forming first, second, and third eFuse cells between TSVs within each of the first, second, and third pairs of TSVs, respectively; connecting the first, second, and third pairs of TSVs and the first, second, and third eFuse cells in respective series in an electric circuit; stacking the first, second, and third wafers in the 3D IC stack, the first, second, and third pair of TSVs aligned vertically; programming the first and second eFuse cells; and testing the first, second, and third pairs of TSVs.

Aspects of the present disclosure include electrically connecting the first, second, and third pairs of TSVs and the first, second, and third eFuse cells via a thin metal layer of the first, second, and third wafers, respectively. Other aspects include testing the first, second, and third pairs of TSVs before stacking the first, second, and third wafers by: applying a DC signal to a first TSV of each of the first, second, and third pairs of TSVs; and monitoring the DC signal at a second TSV of each of the first, second, and third pairs of TSVs, respectively. Further aspects include testing the first, second, and third pairs of TSVs after stacking the first, second, and third wafers by: applying a DC signal to the first TSV of the first pair of TSVs; and monitoring the DC signal at the second TSV of the first pair of TSVs.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIG. 2 schematically illustrates a pre-bond TSV test circuit diagram for testing wide I/O or power/ground TSVs using an eFuse cell, in accordance with an exemplary embodiment;

FIG. 3 schematically illustrates a post-bond TSV test circuit diagram for testing wide I/O or power/ground TSVs using an eFuse cell, in accordance with an exemplary embodiment;

DETAILED DESCRIPTION

Figure 1:
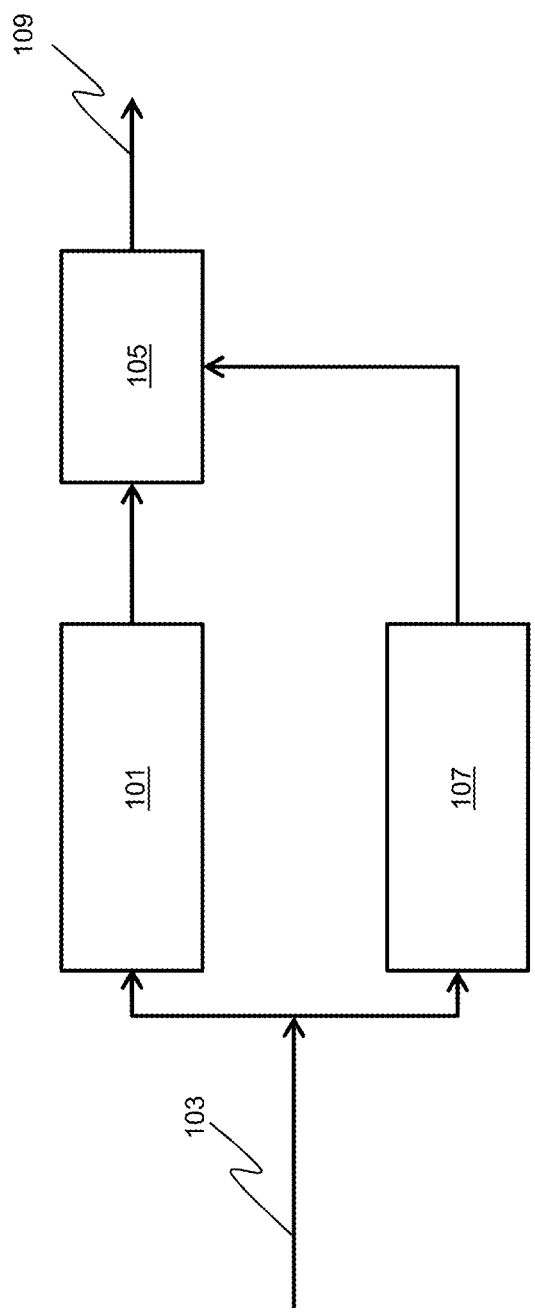
FIG. 1 schematically illustrates a background TSV test circuit diagram for testing a TSV top end.

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of limited test access, single-ended measurements, and new types of defects attendant upon forming 3D ICs using TSVs.

Methodology in accordance with embodiments of the present disclosure includes providing a wafer of a 3D IC stack, the wafer having thin and thick metal layers. First and second TSVs are formed on the wafer, the first and second TSVs laterally separated. An eFuse is formed cell between and separated from the first and second TSVs. A FF is formed adjacent to the second TSV and on an opposite side of the second TSV from the eFuse cell. The first TSV, the eFuse cell, the second TSV, and the FF are connected in series in an electric circuit and the first and second TSVs are tested prior to bonding the wafer to a subsequent wafer in the 3D IC stack.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIG. 2 schematically illustrates a pre-bond TSV test circuit diagram for testing wide I/O and power/ground TSVs using an eFuse cell, in accordance with an exemplary embodiment. Adverting to FIG. 2, a TSV 201, an eFuse cell 203, a TSV 205, and a FF 207 are connected in series on a wafer of a 3D IC (not shown for illustrative convenience), the wafer having thin and thick metal layers.

The TSVs 201 and 205 may be wide I/O TSVs or power/ground TSVs. The wide I/O TSVs are used for signal transmission purposes between two dies, so they carry input and output signals which have a lower current magnitude and, therefore, can be routed through thin metal layers, e.g., M1, M2, and M3. Thin metal layers typically have a lower current carrying capability, e.g., 0.5 milliamps (mA) to 2 mA. Therefore, if the TSVs 201 and 205 are wide I/O TSVs, then the TSVs 201 and 205 and the eFuse cell 203 are connected to a thin metal layer of the wafer, e.g., M2.

In contrast, power/ground TSVs are used to provide power and ground rails to the circuits in the stacked/top die. Since these TSVs are part of the power delivery network for the top die, they are routed through thicker metal layers, e.g., M4. Thick metal layers typically have a higher current carry capability, e.g., 8.5 mA to 9 mA. Therefore, if the TSVs 201 and 205 are power/ground TSVs, then the TSVs 201 and 205 and the eFuse cell 203 are connected to a thick metal layer of the wafer, e.g., M4.

A delay circuit 209 is also formed in parallel with the TSVs 201 and 205 and the eFuse cell 203, and connected to the FF 207. Prior to bonding the wafer to a subsequent wafer of the 3D IC stack, a test stimulus 211, e.g., a DC signal, is applied simultaneously to the delay circuit 209 and to the TSVs 201 and 205 and the eFuse 203. The TSV test circuit is used to charge/discharge and sense the voltage level at the top end of TSVs 201 and 205. The TSVs 201 and 205 act as load capacitors with respect to the test stimulus 211 and the charge/discharge waveform 213 at the output of the FF 207 is monitored. Consequently, defective TSVs 201 and/or 205 will show an increased delay relative to the delay circuit 209.

FIG. 3 schematically illustrates a post-bond TSV test circuit diagram for testing wide I/O and power/ground TSVs using an eFuse cell, in accordance with an exemplary embodiment. Similar to the pre-bond TSV test circuit of FIG. 2, a TSV 301, an eFuse cell 303, a TSV 305, and a FF 307 are connected in series on a wafer of a 3D IC stack (not shown for illustrative convenience), the wafer having thin and thick metal layers, as described above. The TSVs 301 and 305 may be wide I/O TSVs or power/ground TSVs. Again, if the TSVs 301 and 305 are wide I/O TSVs, then the TSVs 301 and 305 and the eFuse cell 303 are connected to a thin metal layer of the wafer, e.g., M2, and if the TSVs 301 and 305 are power/ground TSVs, then the TSVs 301 and 305 and the eFuse cell 303 are connected to a thick metal layer of the wafer, e.g., M4.

Similar to FIG. 2, a delay circuit 309 is also formed in parallel with the TSVs 301 and 305 and the eFuse cell 303, and connected to the FF 307. The TSVs 301 and 305 are connected with a top-die of a subsequent wafer of the 3D IC stack shown by the line 311. Next, the eFuse cell 303 is programmed or blown, as shown by the dashed line 313, with an electric pulse in the range of 25 µA to 40 µA, for example. After the wafer is bonded to a subsequent wafer in the 3D IC stack, a test stimulus 315, e.g., a DC signal, is applied simultaneously to the delay circuit 309 and to the TSVs 301 and 305 and the eFuse 303. Again, the TSV test circuit is used to charge/discharge and sense the voltage level at the top end of TSVs 301 and 305. The TSVs 301 and 305 act as load capacitors with respect to the test stimulus 315 and the charge/discharge waveform 317 at the output of the FF 307 is monitored. Consequently, defective TSVs 301 and/or 305 will show an increased delay relative to the delay circuit 309.

Figure 4:
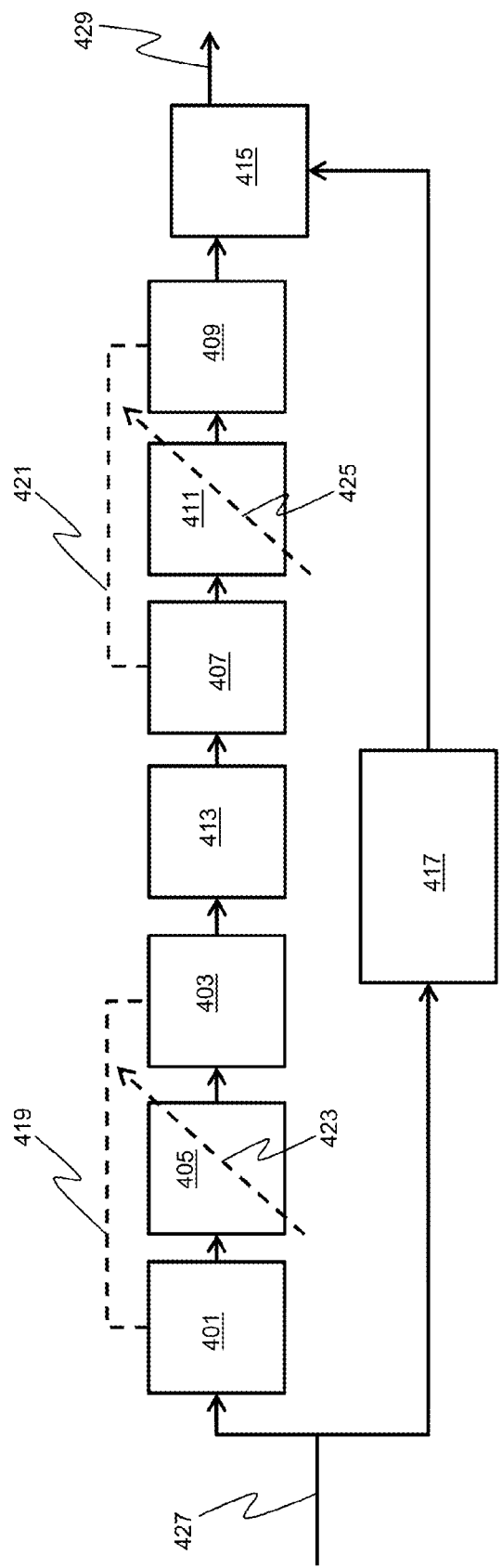
FIG. 4 schematically illustrates a large chain implementation of the post-bond TSV test circuit diagram for testing wide I/O or power/ground TSVs using eFuse cells, in accordance with an exemplary embodiment.

FIG. 4 schematically illustrates a large chain implementation of the post-bond TSV test circuit diagram for testing wide I/O or power/ground TSVs using eFuse cells, in accordance with an exemplary embodiment. Adverting to FIG. 4, a pair of TSVs, e.g., TSV 401 and TSV 403, are connected in series with an eFuse cell 405 and another pair of TSVs, e.g., TSV 407 and 409, are connected in series with eFuse 411 on a wafer of a 3D IC stack (not shown for illustrative convenience), the wafer having thin and thick metal layers, as described above. The adjacent pairs of TSVs are also connected in series on the wafer with an eFuse 413 therebetween. The TSVs 401, 403, 407, and 409, and the eFuse 405, 411, and 413 are also connected in series with a FF 415. Again, the TSVs 401, 403, 407, and 409 may be wide I/O TSVs or power/ground TSVs. Consequently, if the TSVs 401, 403, 407, and 409 are wide I/O TSVs, then the TSVs 401, 403, 407, and 409 and the eFuse cells 405, 411, and 413 are connected to a thin metal layer of the wafer, e.g., M2, and if the TSVs 401, 403, 407, and 409 are power/ground TSVs, then the TSVs 401, 403, 407, and 409 and the eFuse cells 405, 411, and 413 are connected to a thick metal layer of the wafer, e.g., M4.

Similar to FIG. 3, a delay circuit 417 is also formed in parallel with the TSVs 401, 403, 407, and 409 and the eFuse cells 405, 411, and 413, and connected to the FF 415. The pairs of TSVs 401 and 403 and 407 and 409 are then each connected with a top-die of a subsequent wafer of the 3D IC stack shown by the lines 419 and 421, respectively. Next, the eFuse cells 405 and 411 are programmed or blown as shown by the dashed lines 423 and 425 with an electric pulse in the range of 25 µA to 40 µA, for example. After the wafer is bonded to a subsequent wafer of the 3D IC stack, a test stimulus 427, e.g., a DC signal, is applied simultaneously to the delay circuit 417 and to the TSVs 401, 403, 407, and 409 and the eFuse cells 405, 411, and 413. Again, the TSV test circuit is used to charge/discharge and sense the voltage level at the top end of TSVs 401, 403, 407, and 409. The TSVs 401, 403, 407, and 409 act as load capacitors with respect to the test stimulus 427 and the charge/discharge waveform 429 at the output of the FF 415 is monitored. Consequently, defective TSVs 401, 403, 407, and/or 409 will show an increased delay relative to the delay circuit 417.

Figure 5:
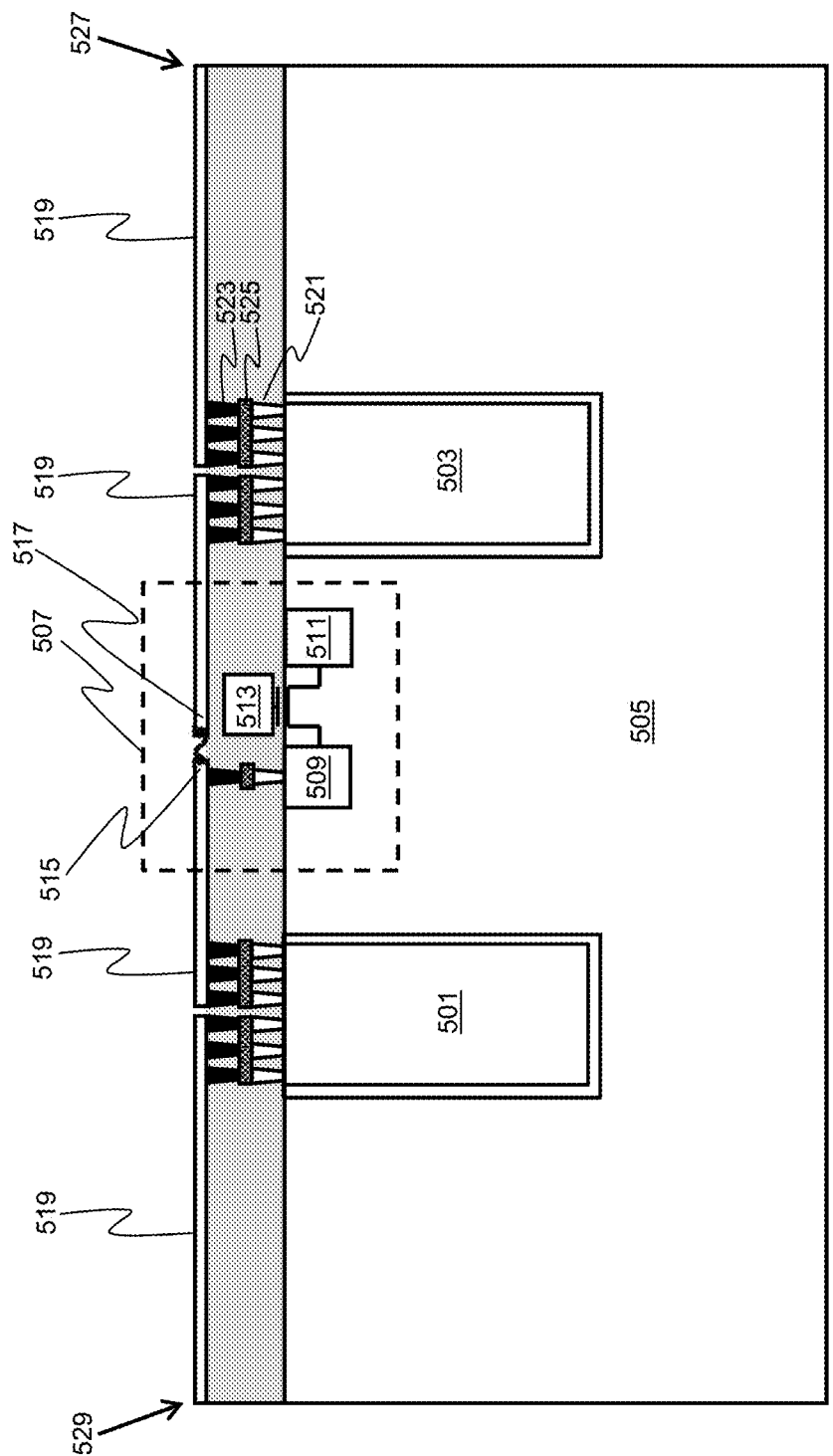
FIG. 5 schematically illustrates a cross-sectional view of a pre-bond wide I/O TSVs design for testing (DfT) structure, in accordance with an exemplary embodiment.

FIG. 5 schematically illustrates a cross-sectional view of a pre-bond wide I/O TSVs DfT structure, in accordance with an exemplary embodiment. Adverting to FIG. 5, wide I/O TSVs 501 and 503 are formed on a wafer 505 of a 3D IC stack. An eFuse cell 507 represented by the dashed boundary line is formed between and separated from the TSVs 501 and 503. The eFuse cell 507 is formed of a programming field-effect transistor (FET) (Prog-FET) having a drain 509, a source 511, and a gate 513 as well as a cathode 515 and an anode 517. The eFuse cell 507 may be formed, for example, to a size of 1.22 micrometers (µm)×0.3 µm and the TSVs 501 and 503 may have a pitch of 40 µm, for example. Therefore, the eFuse cell 507 may be placed between the TSVs 501 and 503 and still maintain a very big keep-out zone to ensure stress free performance of the eFuse cell 507. The TSVs 501 and 502 are ultimately connected to a metal layer 519 of the wafer 505, e.g., M2, through vias 521 and 523, e.g., V0 and V1, respectively, and a metal layer 525, e.g., M1, on the wafer 505. As described in FIG. 2, the thin metal layer 519 is also connected in series to a FF (not shown for illustrative convenience) on the side of the metal layer 519 depicted by the arrow 527. Consequently, the TSVs 501 and 503, the eFuse cell 507, and the FF are connected in series in an electric circuit. A delay circuit (not shown for illustrative convenience) is also connected in parallel with the TSVs 501 and 503 and the eFuse cell 507 on the side of the thin metal layer 519 depicted by the arrow 529, and connected to the FF. Prior to bonding the wafer to a subsequent wafer in the 3D IC stack, a test stimulus, e.g., a DC signal, is applied simultaneously to the delay circuit and to the TSVs 501 and 503 and the eFuse cell 507 to determine if there are any defects with the TSVs 501 and 503. Consequently, defective TSVs 501 and/or 503 will show an increased delay relative to the delay circuit.

Figure 6:
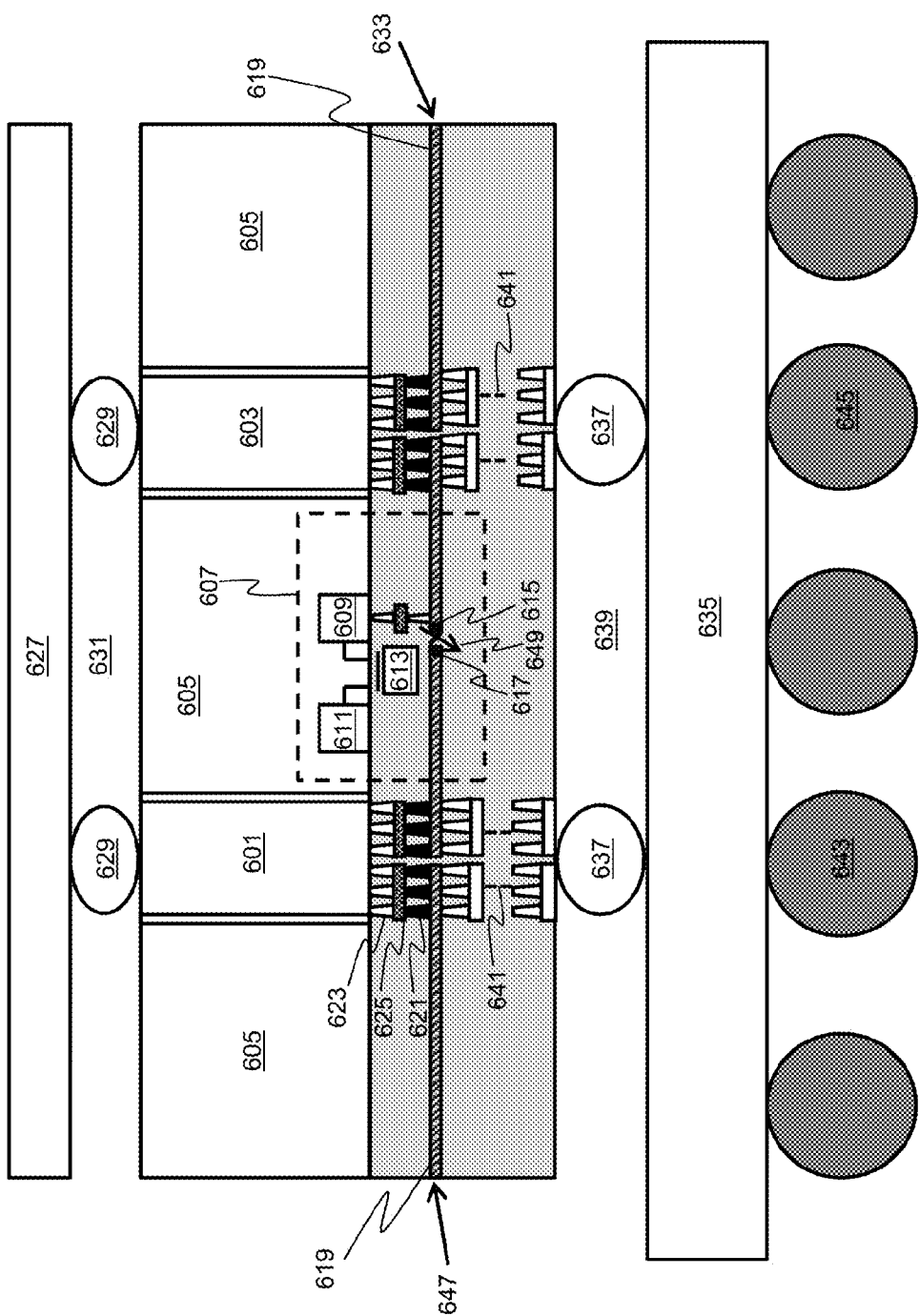
FIG. 6 schematically illustrates a cross-sectional view of a post bond wide I/O TSVs Dft structure, in accordance with an exemplary embodiment.

FIG. 6 schematically illustrates a cross-sectional view of a post bond wide I/O TSVs Dft structure, in accordance with an exemplary embodiment. Adverting to FIG. 6, wide I/O TSVs 601 and 603 are formed in a TSV die 605. An eFuse cell 607 represented by the dashed boundary line is formed between and separated from the TSVs 601 and 603. The eFuse cell 607 is formed of a Prog-FET having a drain 609, a source 611, and a gate 613 as well as a cathode 615 and an anode 617. Similar to FIG. 5, the TSVs 601 and 602 are ultimately connected to a metal layer 619, e.g., M2. The TSVs 601 and 603 are connected to the metal layer 619 through vias 621 and 623, e.g., V0 and V1, respectively, and the metal layer 625, e.g., M1.

As described in FIG. 3, the TSVs 601 and 603 are connected with a top-die 627 of a subsequent wafer of the 3D IC stack via microbumps 629 and underfill 631. As described in FIG. 5, the metal layer 619 is also connected in series to a FF (not shown for illustrative convenience) on the side of the metal layer 619 depicted by the arrow 635. Consequently, the TSVs 601 and 603, the eFuse cell 607, and the FF are connected in series in an electric circuit. In addition, the TSVs 601 and 603 are connected to the substrate 635, metal bumps 637, underfill 639, and the back-end-of-line (BEOL) stacks 641, which are represented by dashed lines. Further, the substrate 635 is connected to a Ball Grid Array (BGA) pogo pin test input 643 and a BGA pogo pin test output 645.

A delay circuit (not shown for illustrative convenience) is also connected in parallel with the TSVs 601 and 603 and the eFuse cell 607 on the side of the metal layer 619 depicted by the arrow 647, and connected to the FF. As described in FIG. 3, the eFuse cell 607 is programmed or blown as shown by the arrow 649 with an electric pulse in the range of 25 µA to 40 µA, for example. In particular, the Prog-FET is used to generate a desired programming pulse, e.g. 5 microseconds (µs) to 10 µs by modulating the gate 613 of the Prog-FET. As a result, electrons flow from the drain 609 to the cathode 615 and then to the anode 617. After the substrate 635 is bonded to the top die 627 of the 3D IC stack, a test stimulus, e.g., a DC signal, is applied simultaneously to the delay circuit and to the TSVs 601 and 603 and the eFuse cell 607 to determine if there are any defects with the TSVs 601 and 603. Consequently, defective TSVs 601 and/or 603 will show an increased delay relative to the delay circuit.

Figure 7:
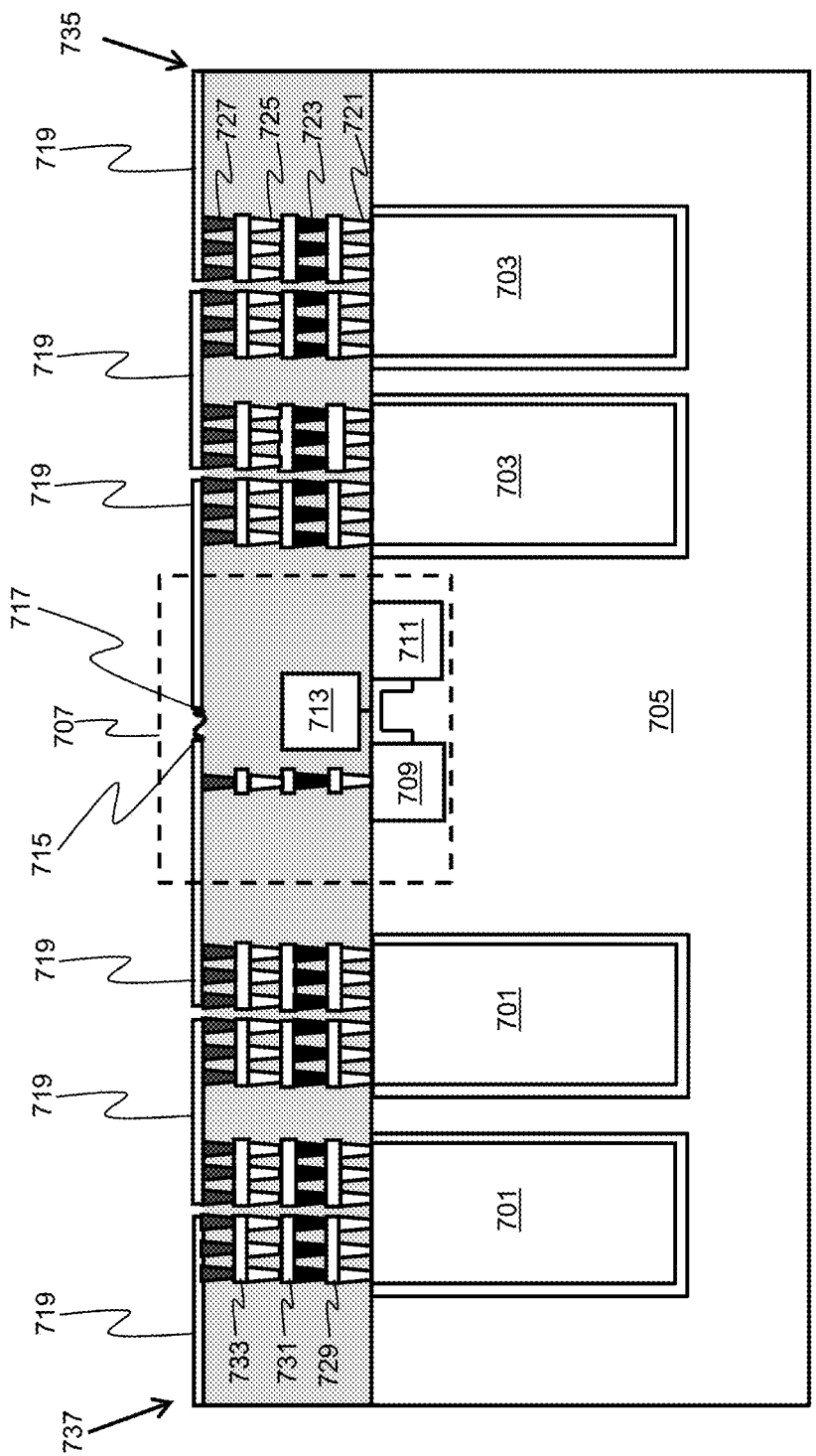
FIG. 7 schematically illustrates a cross-sectional view of a pre-bond power/ground TSVs DfT structure, in accordance with an exemplary embodiment.

FIG. 7 schematically illustrates a cross-sectional view of a pre-bond power/ground TSVs DfT structure, in accordance with an exemplary embodiment. Adverting to FIG. 7, power/ground TSVs 701 and 703 are formed in a TSV die 705. An eFuse cell 707 represented by the dashed boundary line is formed between and separated from the power TSVs 701 and 703. As described above, the eFuse cell 707 is formed of a Prog-FET having a drain 709, a source 711, and a gate 713 as well as a cathode 715 and an anode 717. The TSVs 701 and 703 are ultimately connected to a metal layer 719, e.g., M4, through vias 721, 723, 725, and 727, e.g., V0, V1, V2, and V3, respectively, and metal layers 729, 731, and 733, e.g., M1, M2, and M3, respectively.

As described in FIG. 5, the metal layer 719 is also connected in series to a FF (not shown for illustrative convenience) on the side of the metal layer 719 depicted by the arrow 735. Consequently, the TSVs 701 and 703, the eFuse cell 707, and the FF are connected in series in an electric circuit. A delay circuit (not shown for illustrative convenience) is also connected in parallel with the TSVs 701 and 703 and the eFuse cell 707 on the side of the metal layer 719 depicted by the arrow 737, and connected to the FF. Prior to bonding the wafer to a subsequent wafer in the 3D IC stack, a test stimulus, e.g., a DC signal, is applied simultaneously to the delay circuit and to the TSVs 701 and 703 and the eFuse cell 707 to determine if there are any defects with the TSVs 701 and 703. Consequently, defective TSVs 701 and/or 703 will show an increased delay relative to the delay circuit.

Figure 8:
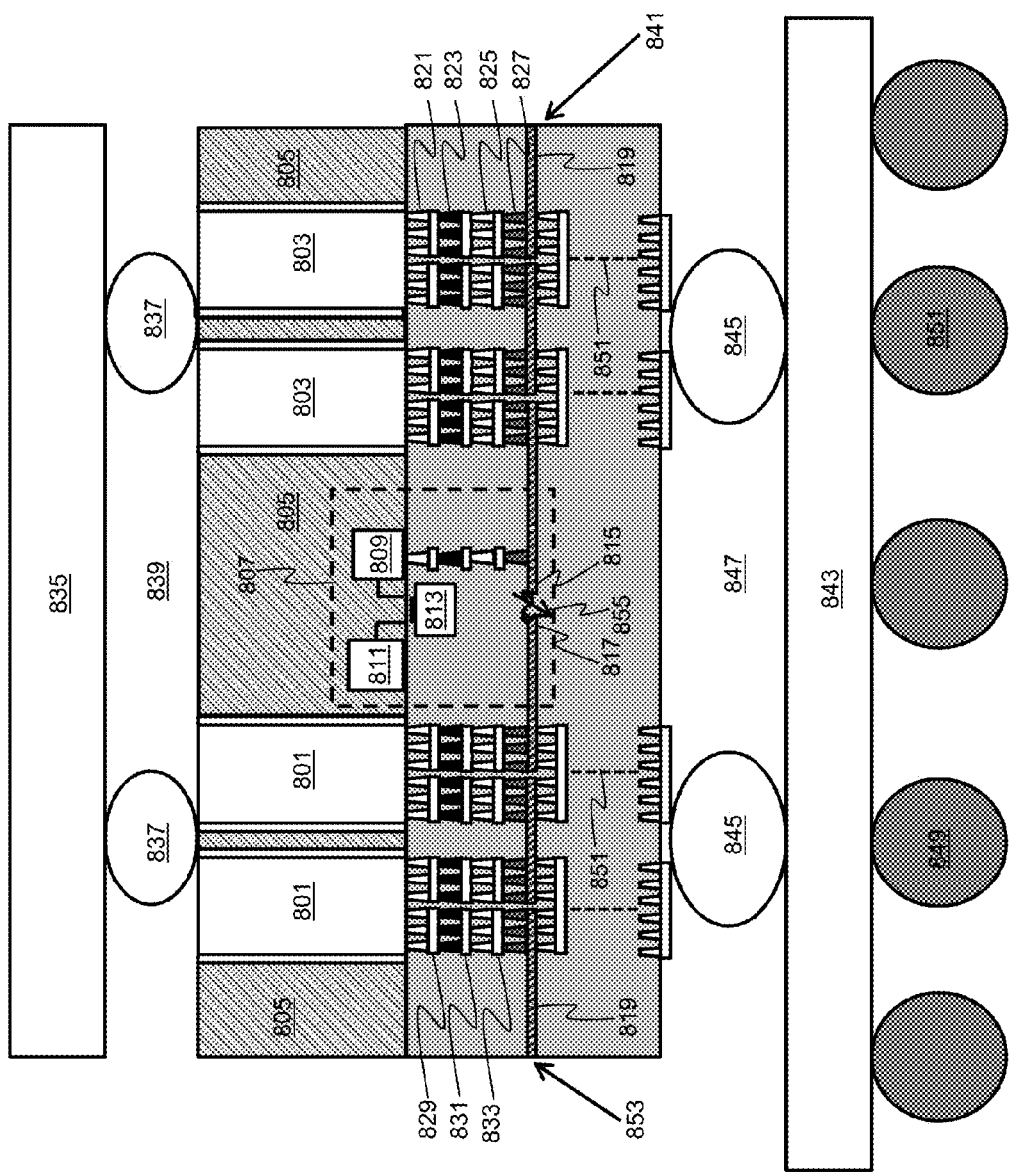
FIG. 8 schematically illustrates a cross-sectional view of a post bond power/ground TSVs Dft structure, in accordance with an exemplary embodiment.

FIG. 8 schematically illustrates a cross-sectional view of a post bond power/ground TSVs Dft structure, in accordance with an exemplary embodiment. Adverting to FIG. 8, power/ground TSVs 801 and 803 are formed in a TSV die 805. An eFuse cell 807 represented by the dashed boundary line is formed between and separated from the TSVs 801 and 803. Again, the eFuse cell 607 is formed of a Prog-FET having a drain 809, a source 811, and a gate 813 as well as a cathode 815 and an anode 817. The TSVs 801 and 803 are connected to the metal layer 819 through vias 821, 823, 825, and 827, e.g., V0, V1, V2, V3, and V4, respectively, and the metal layers 829, 831, and 833, e.g., M1, M2, and M3, respectively.

As described in FIG. 6, the TSVs 801 and 803 are connected with a top-die 835 of a subsequent wafer of the 3D IC stack via microbumps 837 and underfill 839. As described in FIG. 7, the metal layer 819 is also connected in series to a FF (not shown for illustrative convenience) on the side of the metal layer 819 depicted by the arrow 841. Consequently, the TSVs 801 and 803, the eFuse cell 807, and the FF are connected in series in an electric circuit. In addition, the TSVs 801 and 803 are connected to the substrate 843, metal bumps 845, underfill 847, and the BEOL stacks 849, which are represented by dashed lines. Further, the substrate 843 is connected to a BGA pogo pin test input 849 and a BGA pogo pin test output 851.

A delay circuit (not shown for illustrative convenience) is also connected in parallel with the TSVs 801 and 803 and the eFuse cell 807 on the side of the metal layer 819 depicted by the arrow 853, and connected to the FF. As described in FIG. 3, the eFuse cell 807 is programmed or blown as shown by the arrow 855 with an electric pulse in the range of 25 µA to 40 µA, for example. As a result, electrons flow from the drain 809 to the cathode 815 and then to the anode 817. After the substrate 845 is bonded to the top die 837 of the 3D IC stack, a test stimulus, e.g., a DC signal, is applied simultaneously to the delay circuit and to the TSVs 801 and 803 and the eFuse cell 807 to determine if there are any defects with the TSVs 801 and 803. Consequently, defective TSVs 801 and/or 803 will show an increased delay relative to the delay circuit.

Figure 9:
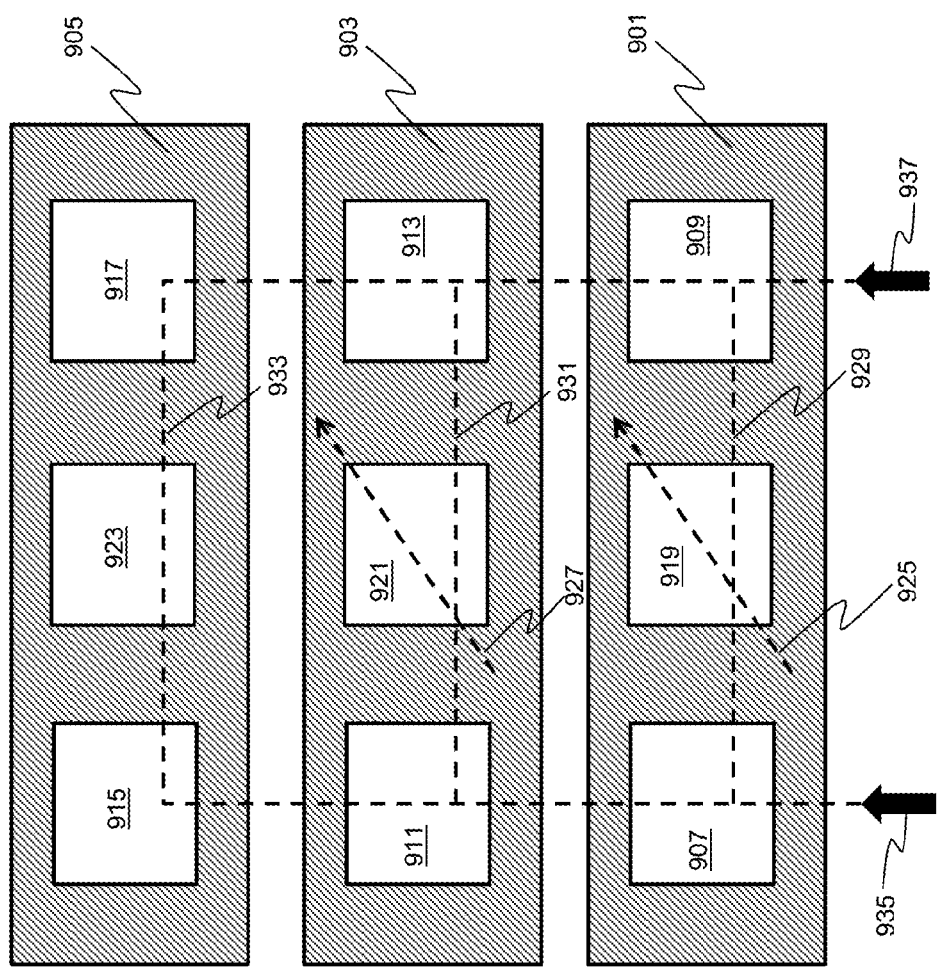
FIG. 9 schematically illustrates a top-down view of a pre-bond and post-bond TSV test circuit diagram for testing multi-tier 3D IC stack using eFuse cells, in accordance with an exemplary embodiment.

FIG. 9 schematically illustrates a top-down view of a pre-bond and post-bond TSV test circuit diagram for testing multi-tier 3D IC stack using eFuse cells, in accordance with an exemplary embodiment. Adverting to FIG. 9, wafers 901, 903, and 905 of a 3D IC stack are formed with pairs of TSVs 907 and 909, 911 and 913, and 915 and 917, respectively. EFuses 919, 921, and 923 are formed between the pairs of TSVs 907 and 909, 911 and 913, and 915 and 917, respectively. Similar to the steps described with respect to FIG. 2, each of the wafers 901, 903, and 905 may be tested pre-bonding to a subsequent wafer in the 3D IC stack by applying a DC signal to a first of the pair of TSVs of each wafer 901, 903, and 905, e.g., 907, 911, and 915, respectively, and then monitoring the DC signal at a second of the pair of TSVs of each wafer 901, 903, and 905, e.g., 909, 913, and 917, respectively, as depicted by the dashed lines 929, 931, and 933, respectively.

Once each pair of TSVs 907 and 909, 911 and 913, and 915 and 917 is tested, the wafers 901, 903, and 905 may be attached/bonded into a 3D IC stack with the pairs of TSVs 907 and 909, 911 and 913, and 915 and 917 aligned vertically, respectively. As a result, the TSVs 907 and 909 are connected to the TSVs 911 and 913 and the TSVs 911 and 913 are connected to the TSVs 915 and 917. Next, the eFuses 919 and 921 can be programmed or blown and as described in FIGS. 3, 5, and 7, as shown by the dashed arrows 925 and 927, respectively. After each wafer is bonded to a subsequent wafer in the 3D IC stack, a DC signal shown as the arrow 935 may be applied to the TSV 907, for example, and the DC signal can be monitored at the TSV 909 as shown by the arrow 937 or vice-versa.

The embodiments of the present disclosure can achieve several technical effects including detecting new types of defects such as breaks, voids and pin-hole type of process-related defects in TSVs with a high defect sensitivity. In addition, eFuse cells can be programmed/blown after pre-bond testing to form a daisy chain through the top-die connection. As a result, the disclosed methodology is easy to implement for testing high density TSVs in wide I/O area for memory-on-logic stacking applications. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure enjoys industrial applicability in any of various highly integrated semiconductor devices including 3D IC stacks.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   providing a wafer of a three-dimensional (3D) integrated circuit (IC) stack, the wafer having thin and thick metal layers;
   forming first and second through-silicon-vias (TSVs) on the wafer, the first and second TSVs laterally separated;
   forming an electronic fuse (eFuse) cell between and separated from the first and second TSVs;
   forming a flip-flop (FF) adjacent to the second TSV and on an opposite side of the second TSV from the eFuse cell;
   connecting the first TSV, the eFuse cell, the second TSV, and the FF in series in an electric circuit; and
   testing the first and second TSVs prior to bonding the wafer to a subsequent wafer in the 3D IC stack.

2. The method according to claim 1, comprising forming the first and second TSVs as first and second wide input/output (I/O) TSVs, respectively.

3. The method according to claim 2, comprising electrically connecting the first TSV, the eFuse cell, and the second TSV via a thin metal layer of the wafer.

4. The method according to claim 1, comprising forming the first and second TSVs as first and second power/ground TSVs, respectively.

5. The method according to claim 4, comprising electrically connecting the first TSV, the eFuse cell, and the second TSV via a thick metal layer of the wafer.

6. The method according to claim 1, further comprising forming a delay circuit in parallel with the first TSV, the eFuse cell, and the second TSV and connected to the FF.

7. The method according to claim 6, comprising testing the first and second TSVs by:
   applying a DC signal simultaneously to the delay circuit and to the first TSV, the eFuse cell, and the second TSV; and
   comparing transmission rates between the first TSV, the eFuse cell, and the second TSV and the FF and the delay circuit and the FF.

8. A method comprising:
   providing a wafer of a three-dimensional (3D) integrated circuit (IC) stack, the wafer having thin and thick metal layers;
   forming one or more pairs of through-silicon-vias (TSVs) on the wafer, each TSV of the one or more pairs laterally separated from another TSV of the one or more pairs;
   forming an electronic fuse (eFuse) cell between and separated from TSVs within each of the one or more pairs of TSVs;
   forming a flip-flop (FF) adjacent to a last TSV of the one or more pairs of TSVs and on an opposite side of the last TSV from the eFuse cell;
   connecting each of the one or more pairs of TSVs with a top-die of a subsequent wafer of the 3D IC stack;
   connecting each of the one or more pairs of TSVs, each eFuse, and the FF in series in an electric circuit;
   programming each eFuse; and
   testing the one or more pairs of TSVs after bonding the wafer to a subsequent wafer in the 3D IC stack.

9. The method according to claim 8, further comprising forming a second eFuse cell between two adjacent pairs of TSVs of the one or more pairs of TSVs.

10. The method according to claim 9, comprising forming each TSV of the one or more pairs of TSVs as a wide input/output (I/O) TSV.

11. The method according to claim 10, comprising electrically connecting the one or more pairs of TSVs, each eFuse cell, and each second eFuse cell via a thin metal layer of the wafer.

12. The method according to claim 9, comprising forming each TSV of the one or more pairs of TSVs as a power/ground TSV.

13. The method according to claim 12, comprising electrically connecting the one or more pairs of TSVs, each eFuse cell, and each second eFuse cell via a thick metal layer of the wafer.

14. The method according to claim 8, comprising programming each eFuse cell with an electric pulse in a range of 25 microamps (μA) to 40 μA.

15. The method according to claim 9, further comprising forming a delay circuit in parallel with the one or more pairs of TSVs, each eFuse cell, and each second eFuse cell and connected to the FF.

16. The method according to claim 9, comprising testing the one or more pairs of TSVs by:
   applying a DC signal simultaneously to the delay circuit and to the one or more pairs of TSVs, each eFuse cell, and each second eFuse cell; and comparing transmission rates between the one or more pairs of TSVs, each eFuse cell, each second eFuse cell and the FF and the delay circuit and the FF.

17. A method comprising:

providing first, second, and third wafers of a three dimensional (3D) integrated circuit (IC) stack, the first, second, and third wafers having thin and thick metal layers;

forming first, second, and third pairs of through-silicon-vias (TSVs) on the first, second, and third wafers, respectively;

forming first, second, and third electronic fuse (eFuse) cells between TSVs within each of the first, second, and third pairs of TSVs, respectively;

connecting the first, second, and third pairs of TSVs and the first, second, and third eFuse cells in respective series in an electric circuit;

stacking the first, second, and third wafers in the 3D IC stack, the first, second, and third pair of TSVs aligned vertically;

programming the first and second eFuse cells; and testing the first, second, and third pairs of TSVs.

18. The method according to claim 17, comprising electrically connecting the first, second, and third pairs of TSVs and the first, second, and third eFuse cells via a thin metal layer of the first, second, and third wafers, respectively.

19. The method according to claim 17, comprising testing the first, second, and third pairs of TSVs before stacking the first, second, and third wafers by:

applying a DC signal to a first TSV of each of the first, second, and third pairs of TSVs; and monitoring the DC signal at a second TSV of each of the first, second, and third pairs of TSVs, respectively.

20. The method according to claim 19, comprising testing the first, second, and third pairs of TSVs after stacking the first, second, and third wafers by:

applying a DC signal to the first TSV of the first pair of TSVs; and monitoring the DC signal at the second TSV of the first pair of TSVs.

* * * * *